US012628414B2

(12) United States Patent
Tokranov et al.

(10) Patent No.: US 12,628,414 B2
(45) Date of Patent: May 12, 2026

(54) SEMICONDUCTOR DEVICE INCLUDING DIFFUSION BREAK STRUCTURE AND METHOD OF FORMING SEMICONDUCTOR DEVICE

(71) Applicant: GLOBALFOUNDRIES U.S. Inc., Malta, NY (US)

(72) Inventors: Anton Tokranov, Halfmoon, NY (US); Man Gu, Malta, NY (US); Eric Scott Kozarsky, Gansevoort, NY (US); George Mulfinger, Queensbury, NY (US); Hong Yu, Rexford, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 364 days.

(21) Appl. No.: 18/340,463

(22) Filed: Jun. 23, 2023

(65) Prior Publication Data

US 2024/0429237 A1 Dec. 26, 2024

(51) Int. Cl.
*H10D 84/85* (2025.01)
*H10D 64/01* (2025.01)
*H10D 84/01* (2026.01)
*H10D 84/03* (2025.01)

(52) U.S. Cl.
CPC ........... *H10D 84/85* (2025.01); *H10D 64/017* (2025.01); *H10D 84/0188* (2025.01); *H10D 84/038* (2025.01)

(58) Field of Classification Search
CPC .... H10D 84/85; H10D 64/017; H10D 84/038; H10D 84/0188
See application file for complete search history.

(56) References Cited

U.S. PATENT DOCUMENTS

| | | | | |
|---|---|---|---|---|
| 9,608,062 | B1 * | 3/2017 | Tseng ................. | H10D 30/6211 |
| 9,865,704 | B2 | 1/2018 | Xie et al. | |
| 9,917,103 | B1 | 3/2018 | Mulfinger et al. | |
| 10,622,479 | B1 | 4/2020 | Yang | |
| 2003/0040187 | A1 | 2/2003 | Kotani | |
| 2012/0264275 | A1 | 10/2012 | Abadeer et al. | |
| 2016/0336183 | A1 | 11/2016 | Yuan et al. | |
| 2017/0323824 | A1 | 11/2017 | Chang et al. | |
| 2020/0066895 | A1 * | 2/2020 | Cheng ................... | H10D 30/62 |
| 2020/0127013 | A1 | 4/2020 | Pritchard et al. | |

OTHER PUBLICATIONS

European Search Report for related application No. EP23198961.7 dated Mar. 5, 2024.
Lyu et al., Simulation Study on Different Integration Schemes to Form Single Diffusion Break, IEEE Xplore, China Semiconductor Technology International Conference, Jun. 20-21, 2022, pp. 1-3, Shanghai, China.

* cited by examiner

*Primary Examiner* — Christine A Enad

(57) ABSTRACT

A semiconductor device includes an insulating layer, a first semiconductor layer over the insulating layer, a diffusion break structure between a first active region and a second active region and including a first insulating pattern over the insulating layer and an opening over the first insulating pattern, and a conductive gate material over the opening.

20 Claims, 10 Drawing Sheets

SEMICONDUCTOR DEVICE INCLUDING DIFFUSION BREAK STRUCTURE AND METHOD OF FORMING SEMICONDUCTOR DEVICE

BACKGROUND

A semiconductor device may include various transistor devices. Some of these transistor devices may be electrically isolated from one another to properly function in a circuit region of the semiconductor device. Regions for isolation of the transistor devices may be referred to as "diffusion breaks."

While forming diffusion break structures in a semiconductor device, stress distribution in active regions of transistor devices in the semiconductor device may be undesirably changed to deteriorate of performance of the transistor devices. In addition, when diffusion break structures are implemented to provide electrical isolation, which requires wiring to the diffusion break structures, the fabrication process of the semiconductor device may be relatively complicated.

SUMMARY

Embodiments of the present disclosure relate to a semiconductor device including a diffusion break structure and a method of forming the semiconductor device. In particular, embodiments of the present disclosure relate to a semiconductor device including a single diffusion break structure (SDB), or a double diffusion break structure (DDB), or both.

In an embodiment, a semiconductor device includes an insulating layer, a first semiconductor layer over the insulating layer, a diffusion break structure between a first active region and a second active region and including a first insulating pattern over the insulating layer and an opening over the first insulating pattern, and a conductive gate material over the opening.

In an embodiment, a semiconductor device includes an insulating layer, a first gate structure in a first active region, the first active region including a first semiconductor layer over the insulating layer, a second gate structure in a second active region, the second active region including a second semiconductor layer over the insulating layer, and a third gate structure between the first and second gate structures and including a diffusion break structure and a conductive gate material over the diffusion break structure. The diffusion break structure includes a first insulating pattern over an insulating layer and an opening over the first insulating pattern.

In an embodiment, a method of forming a semiconductor device includes forming an insulating layer, forming a first semiconductor layer over the insulating layer, forming a diffusion break structure between a first active region and a second active region of the semiconductor device, and forming a conductive gate material. Forming the diffusion break structure includes forming an opening and a first insulating pattern under the conductive gate material.

DETAILED DESCRIPTION

Embodiments of the present disclosure relate to a semiconductor device including a diffusion break structure and a method of forming the semiconductor device. In particular, embodiments of the present disclosure relate to a semiconductor device including a single diffusion break structure (SDB), or a double diffusion break structure (DDB), or both.

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1A:
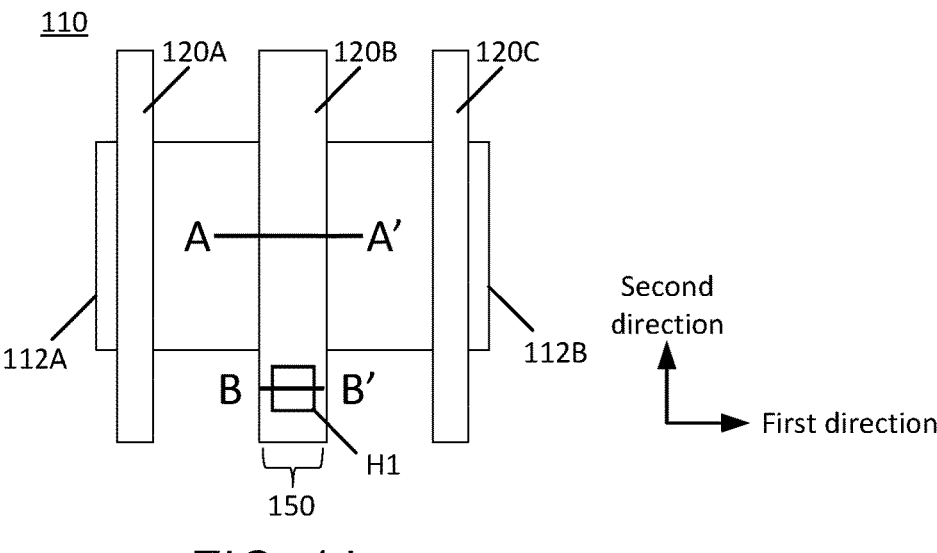
FIGS. 1A, 1B, 1C, and 1D illustrate various schematic views of a semiconductor device including a single diffusion break (SDB) structure according to embodiments.
Figure 1B:
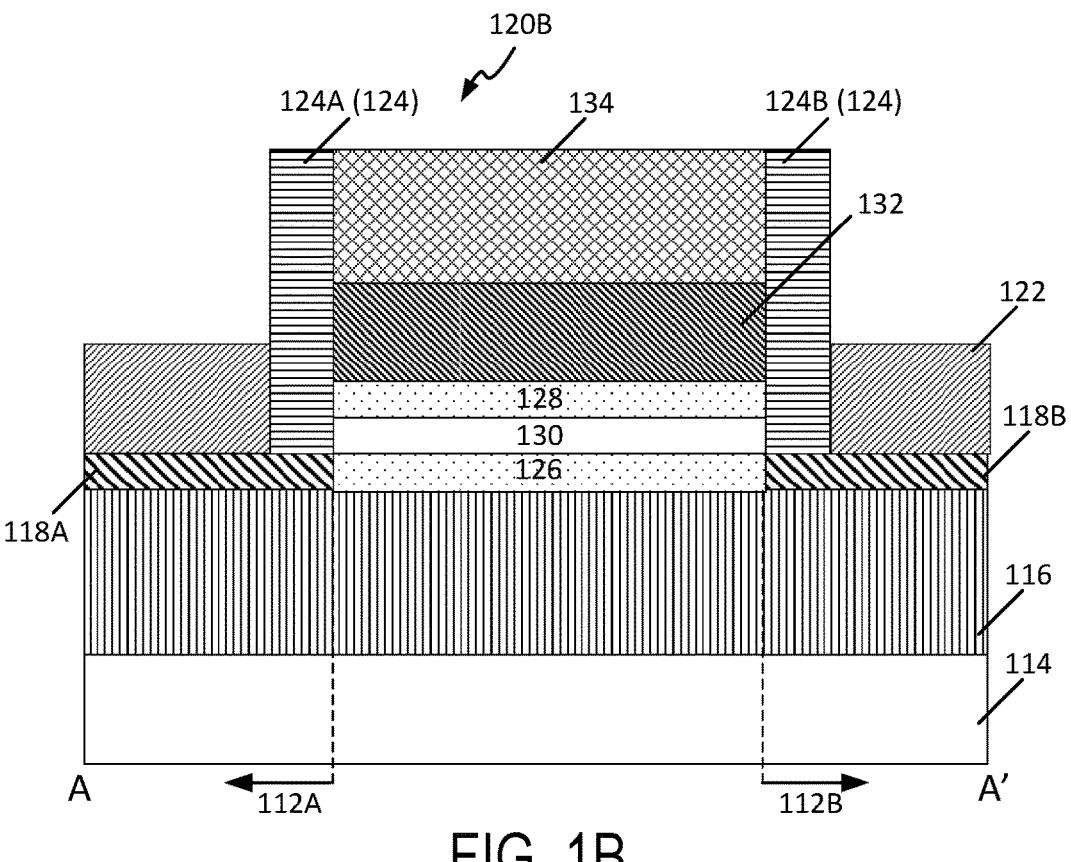
Figures 1C, 1D:
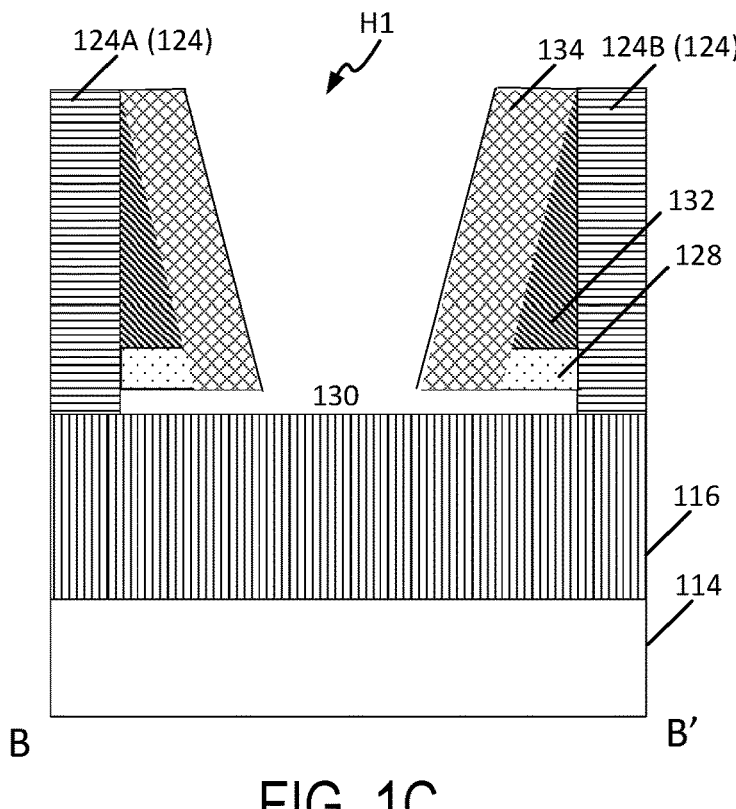

FIGS. 1A, 1B, and 1C illustrate various schematic views of a semiconductor device 110 including a single diffusion break (SDB) structure 150 according to an embodiment. For example, FIG. 1A is a schematic top view of the semiconductor device 110, FIG. 1B is a cross-sectional view of the semiconductor device 110 along a line A-A' in FIG. 1A, and FIG. 1C is a cross-sectional view of the semiconductor device 110 along a line B-B' in FIG. 1A. FIG. 1D is a cross-sectional view of the semiconductor device 110 along the line A-A' in FIG. 1A according to another embodiment.

In an embodiment, the semiconductor device 110 may be an integrated circuit (IC) product (e.g., a logic device, a storage device, etc.), and include planar transistors. For example, the semiconductor device 110 may include NMOS transistors (NFETs), or PMOS transistors (PFETs), or both.

Referring to FIG. 1A, the semiconductor device 110 includes a first active region 112A, a second active region 112B, and first, second, and third gate structures 120A, 120B, and 120C. In an embodiment, each of the first and third gate structures 120A and 120C functions as an active gate, whereas the second gate structure 120B functions as a non-functional gate. The first active region 112A, the second gate structure 120B, and the second active region 112B may be arranged in a first direction (e.g., the horizontal direction with respect to the orientation of FIG. 1A), and the second gate structure 120B may extend beyond the first and second active regions 112A and 112B in a second direction (e.g., the vertical direction respect to the orientation of FIG. 1A) intersecting the first direction. Although the embodiment shown in FIG. 1A includes three gate structures 120A, 120B, and 120C, embodiments of the present disclosure are not limited thereto. In other embodiments, one or both of the first and second active regions 112A and 112B further extend in the first direction, and one or more additional gate structures may be disposed over one or both of the extended active regions 112A and 112B. For example, an active region (e.g., the first or second active region 112A or 112B) in the present disclosure may include a semiconductor layer (e.g., first or second semiconductor layer 118A or 118B) in which one or more channels are formed when one or more active gates (e.g., the first and second gate structures 120A and 120C) disposed over the semiconductor layer operate.

Referring to FIG. 1B, the semiconductor device 110 further includes a semiconductor substrate 114, an insulating layer 116 disposed over the substrate 114, and first and second semiconductor layers (e.g., silicon layers, silicon germanium layers) 118A and 118B disposed over the insulating layer 116. The second gate structure 120B in FIG. 1B includes a gate electrode material (e.g., polysilicon) 132, a conductive gate material (e.g., silicide) 134, and a spacer 124 including first and second portions 124A and 124B. In an embodiment, the gate electrode material 132 and the conductive gate material 134 may be disposed between the first and second portions 124A and 124B of the spacer 124. Although the semiconductor device 110 in FIG. 1B includes a single integrated spacer 124 including the first and second portions 124A and 124B, embodiments of the present disclosure are not limited thereto. For example, in other embodiments, the semiconductor device 110 may include two separate spacers 124A and 124B.

The second gate structure 120B in FIG. 1B further includes the single diffusion break (SDB) structure 150, which is disposed between the first and second active regions 112A and 112B to provide desirable isolation function. For example, the SDB structure 150 includes a first insulating pattern (e.g., a lower insulating pattern) 126, a second insulating pattern (e.g., an upper insulating pattern) 128, and an opening 130, thereby providing physical isolation between the first active region 112A and the second active region 112B. In an embodiment, the SDB structure 150 is disposed over the insulating layer 116 and between the first and second semiconductor layers 118A and 118B, thereby electrically isolating the first and second semiconductor layers 118A and 118B from each other, together with the insulating layer 116.

The lower insulating pattern 126 of the SDB structure 150 in FIG. 1B may be obtained by converting (e.g., oxidizing) a portion of an initial semiconductor layer (e.g., an initial semiconductor layer 118' in FIGS. 2A and 3A) into an insulating material (e.g., silicon oxide) that expands during the converting process, thereby forming the lower insulating pattern 126 abutting the first and second semiconductor layers 118A and 118B. As a result, stress exerted along the first direction (e.g., the A-A' line direction in FIGS. 1A and 1B) in each of the first and second active regions 112A and 112B may be increased to keep lattice spacing in the first and second active regions 112A and 112B along the first direction relatively narrow, thereby improving PFET mobility compared to conventional semiconductor devices.

Referring to FIG. 1C, an upper portion (e.g., a top surface) of the insulating layer 116 is exposed by a hole H1 and the opening 130. The hole H1 may be coupled to the opening 130 and disposed over the conductive gate material 134. In the embodiment shown in FIGS. 1 to 1C, the hole H1 is formed in a region where the second gate structure 120B extends beyond the first and second active regions 112A and 112B in the second direction. The gate electrode material 132 in FIG. 1C is disposed over the second insulating pattern 128.

In the embodiment shown in FIGS. 1B and 1C, the second gate structure 120B includes the gate electrode material 132 disposed over the upper insulating pattern 128. However, embodiments of the present disclosure are not limited thereto. For example, in some embodiments, the second gate structure 120B may include a substantially fully silicided conductive material 134 and omit the gate electrode material 132. In other embodiments, the gate electrode material 132 and the conductive gate material 134 may be substantially completely removed such that the spacer 124 and the single SDB structure 150 including the lower insulating pattern 125, the opening 130, and the upper insulating pattern 128 remain.

Referring to FIG. 1D, the second gate structure 120B' includes the SDB structure 150 including an opening 130' and an insulating pattern 128' disposed over the opening 130'. The opening 130' and the insulating pattern 128' are disposed between the first and second portions 124A and 124B of the spacer 124 and over the insulating layer 116, thereby electrically isolating first and second semiconductor layers 118A' and 118B' from each other, together with the insulating layer 116.

Figures 2A, 2B:
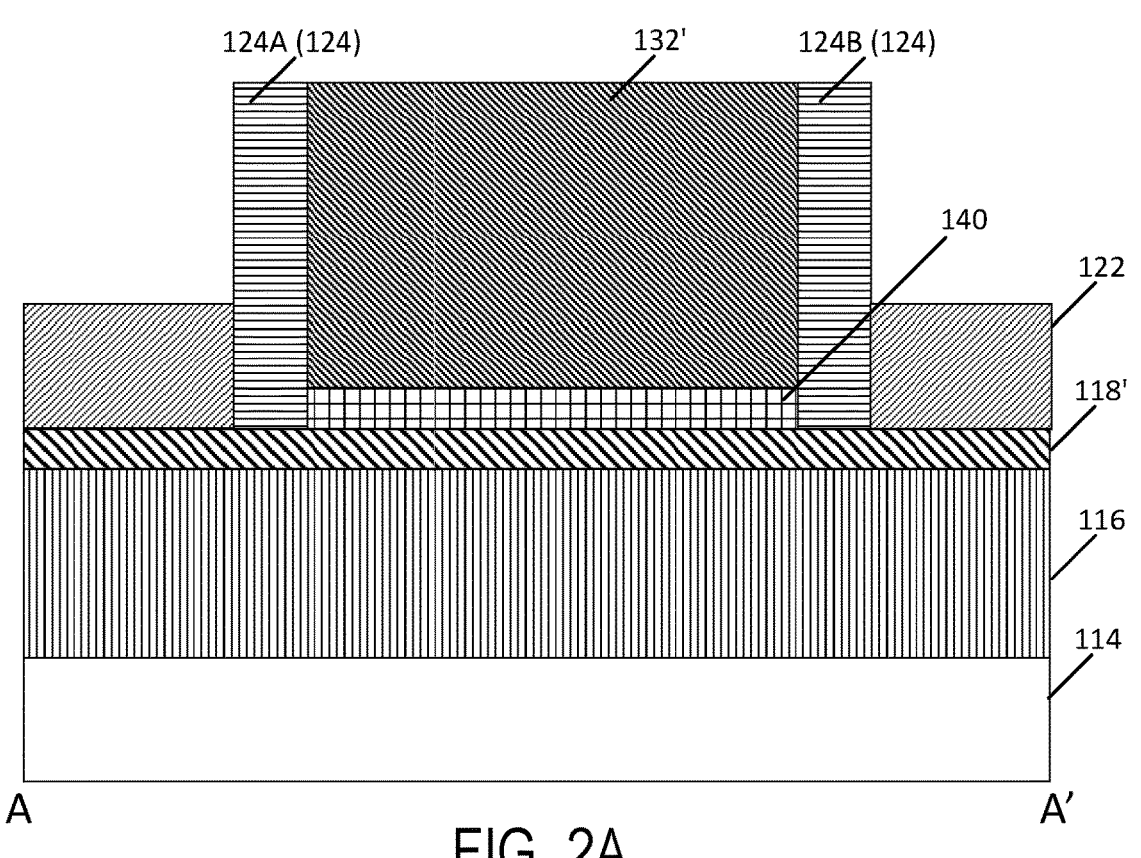
FIGS. 2A, 2B, 3A, 3B, 4A, and 4B illustrate a method of fabricating the semiconductor device in FIG. 1 according to an embodiment.
Figures 3A, 3B:
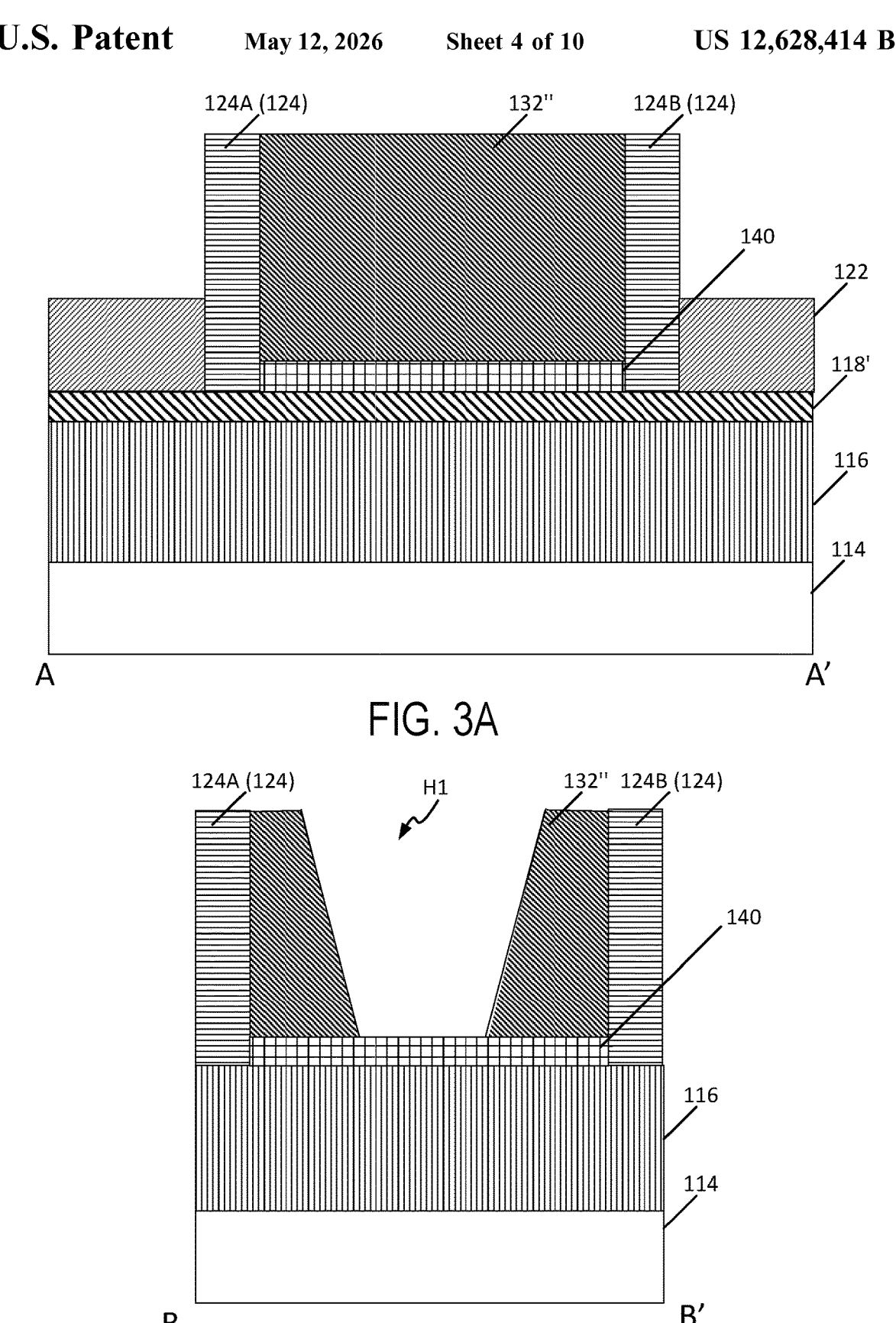
Figure 4A:
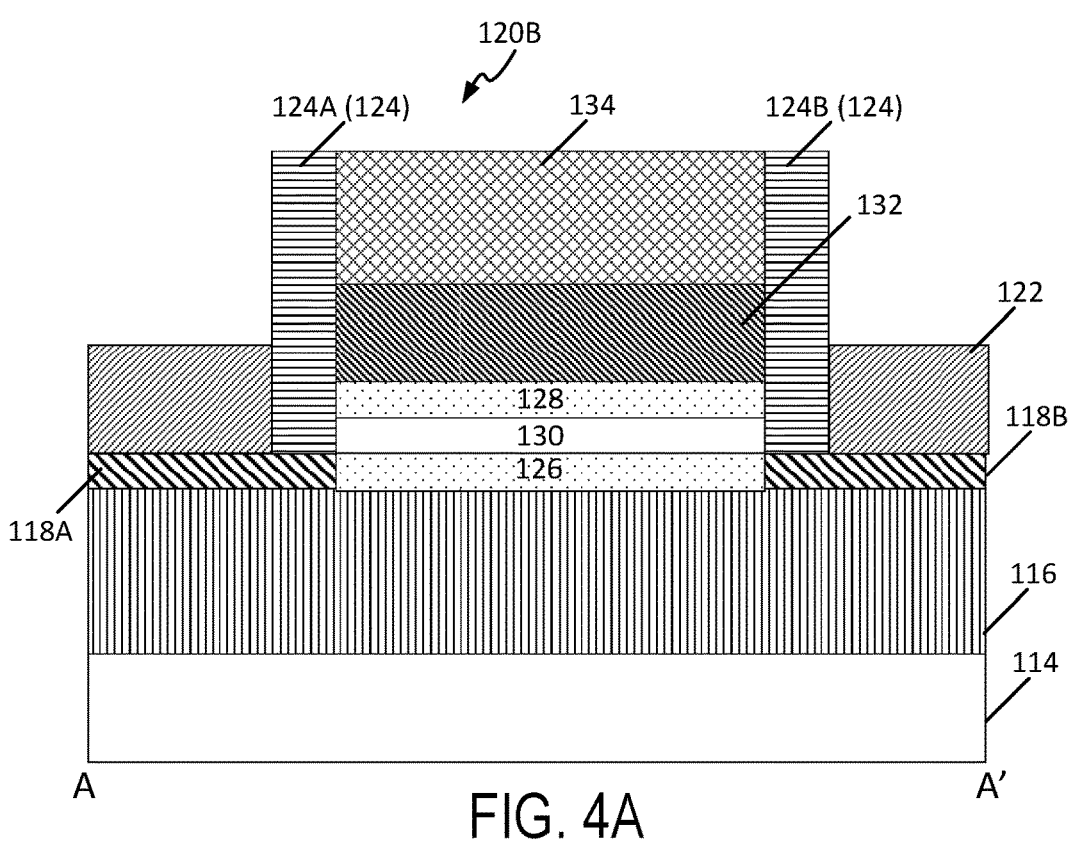

FIGS. 2A, 2B, 3A, 3B, 4A, and 4B illustrate a method of fabricating the semiconductor device 110 in FIG. 1 according to an embodiment. Specifically, FIGS. 2A, 3A, and 4A are simplified cross-sectional views along the line A-A' shown in FIG. 1, and FIGS. 2B, 3B, and 4B are simplified cross-sectional views along the line B-B' shown in FIG. 1.

Referring to FIGS. 2A and 2B, the method includes forming an intermediate semiconductor structure. Such an intermediate semiconductor structure includes a semiconductor substrate 114, an insulating layer 116, an initial semiconductor layer 118', and a spacer 124 including first and second portions 124A and 124B. The intermediate structure further includes a gate dielectric material (e.g., gate oxide material) 140 and an initial gate electrode material 132' disposed between the first and second portions 124A and 124B of the spacer 124.

In an embodiment, the gate dielectric material 140 in FIGS. 2A and 2B includes a high-k insulating material. For example, the gate dielectric material 140 may be Hafnium oxide, and optionally include one or more of Zirconium (Zr), Aluminum (Al), and Lanthanum (La). In some embodiments, a gate work function material (e.g., titanium nitride) is disposed over the gate dielectric material 140.

Referring to FIGS. 3A and 3B, the method includes forming a hole H1 (e.g., the hole H1 in FIGS. 1A and 1C) in a specific region of the initial gate electrode material 132', where the specific region is where a gate structure (e.g., the second gate structure 120B in FIG. 1A) extends beyond the first and second active regions 112A and 112B in a longitudinal direction (e.g., the second direction of FIG. 1A) and lies outside the initial semiconductor layer 118'. Since the hole H1 is formed outside the first and second active regions 112A and 112B, a process margin may be ensured to substantially prevent damaging the active regions 112A and 112B while forming the hole H1.

In an embodiment, a mask pattern (not shown) is formed to expose the specific region of the initial gate electrode material 132' and an etching process (e.g., a dry etching process) is performed on the initial gate electrode material 132' to form the hole H1 until the gate dielectric material 140 is exposed, thereby forming an intermediate gate electrode material 132". For example, a reactive-ion etching may be used to form the hole H1.

Figure 4B:
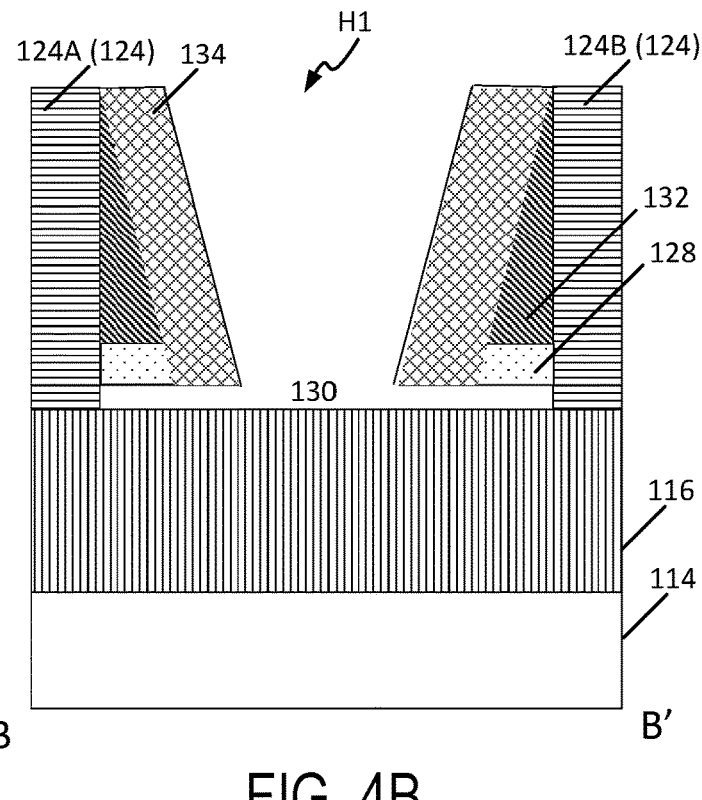

Referring to FIGS. 4A and 4B, the method further includes forming the conductive gate material 134 and the gate electrode material 132. In an embodiment, at least a portion of the intermediate gate electrode material 132" may be converted into the conductive gate material (e.g., silicide) 134 and the remaining portion of the intermediate gate electrode material 132" becomes the gate electrode material 132. For example, a metal (e.g., nickel) may be deposited over the intermediate gate electrode material 132" and an anneal process may be performed to make the metal react with a portion of the intermediate gate electrode material 132" (e.g., polysilicon) to form the conductive gate material (e.g., nickel silicide) 134.

The method further includes selectively removing the gate dielectric material 140 to form an opening 130 using the hole H1. In an embodiment, an etching process is performed by applying an etchant through the hole H1 to selectively remove the gate dielectric material 140. For example, such an etchant may have a relatively high selectivity (e.g., equal to or greater than 50) for the gate dielectric material 140 over the conductive gate material 134, the gate electrode material 132, the spacer 124, and the initial semiconductor layer 118'. For example, the etchant includes sulfuric acid and hydrogen peroxide mix (SPM), which also serves to remove the remaining metal after forming the silicide 134 has been completed. In some embodiments, the etching process is performed to selectively remove the gate dielectric material 140 and the gate work function material disposed over the gate dielectric material 140.

The method further includes converting a portion of the initial semiconductor layer 118' into a first insulating pattern 126, or converting a portion of the gate electrode material 132 into a second insulating pattern 128, or both. In an embodiment, the etchant serves as an oxygen source to oxidize the portion of the initial semiconductor layer 118' and the portion of the gate electrode material 132. For example, the SPM may be used in the etching process performed at a relatively high temperature (e.g., 50-70° C.) during a given time interval sufficiently long (e.g., 30-300 seconds) to ensure proper formation of an SDB structure 150 including the first and second insulating patterns 126 and 128 and the opening 130.

In a conventional semiconductor device including PFETs, non-functional gate structures may be coupled to wires for electrically isolating adjacent active regions while avoiding stress release in the active regions. In contrast, a semiconductor device including PFETs (e.g., the semiconductor device shown in FIG. 1B) according to an embodiment of the present disclosure provides an SDB structure including an opening and one or more insulating patterns for physically separating adjacent active regions, thereby obviating the need of wiring for electrical isolation. In addition, the insulating patterns in the semiconductor device according to an embodiment of the present disclosure may increase stress exerted on the adjacent active regions, thereby improving PFET mobility compared to the conventional semiconductor device.

In a conventional semiconductor device including NFETs, proper alignment in forming non-functional gate structures to physically separate adjacent active regions would be challenging. In contrast, a semiconductor device including NFETs (e.g., the semiconductor device shown in FIG. 1D) according to an embodiment of the present disclosure provides an SDB structure including an opening formed by etching a gate dielectric material (e.g., a high-k insulating material) disposed between spacers, thereby facilitating self-alignment of the SDB structure with the spacers. For example, such a gate dielectric material may be formed directly on an insulating layer (e.g., the insulating layer 116 in FIG. 2A) and between two portions of a spacer (e.g., the first and second portions 124A and 124B of the spacer 124 in FIG. 1D). When the gate dielectric material is etched to form an opening (e.g., the opening 130' in FIG. 1D), the opening may be self-aligned with the portions of the spacer to provide physical isolation between adjacent active regions (e.g., the first and second active regions 112A' and 112B' in FIG. 1D).

Figures 5A, 5B, 5C:
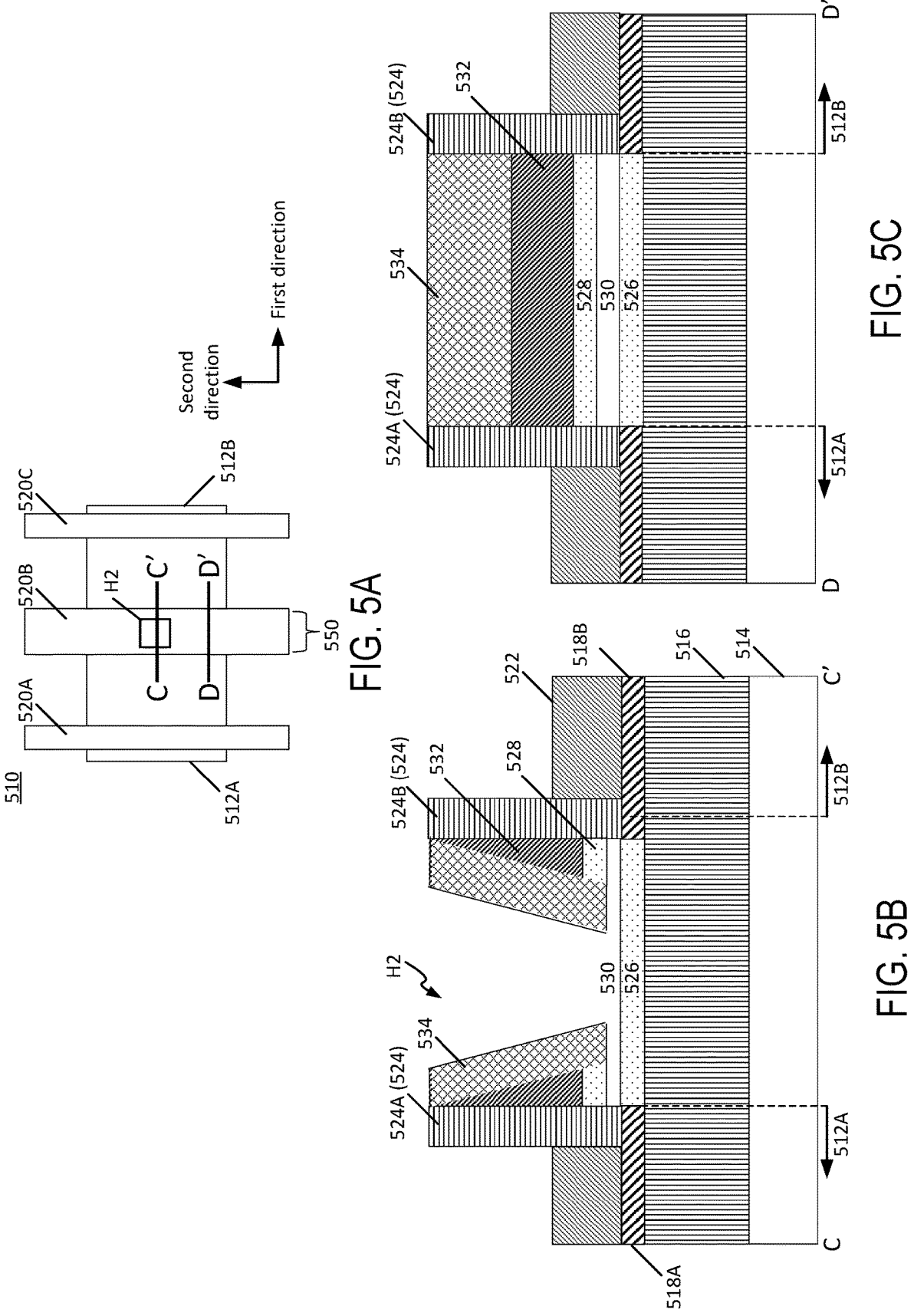
FIGS. 5A, 5B, and 5C illustrate various schematic views of a semiconductor device including a SDB according to an embodiment.

FIGS. 5A, 5B, and 5C illustrate various schematic views of a semiconductor device 510 including a single diffusion break (SDB) 550 according to an embodiment. For example, FIG. 5A is a schematic top view of the semiconductor device 510, FIG. 5B is a cross-sectional view of the semiconductor device 510 along a line C-C' in FIG. 5A, and FIG. 5C is a cross-sectional view of the semiconductor device 510 along a line D-D' in FIG. 5A.

The semiconductor device 510 in FIGS. 5A to 5C includes similar elements to those of the semiconductor device 110 in FIGS. 1A to 1C. Accordingly, detailed descriptions of these similar elements may be omitted in the following disclosure in the interest of brevity.

The semiconductor device 510 in FIGS. 5A to 5C differs from the semiconductor device 110 in FIGS. 1A to 1C in that a hole H2 is formed in a region of a second gate structure 520B between first and second active regions 512A and 512B in a second direction, rather than outside the first and second active regions 512A and 512B in the second direction. As a result, as shown in FIG. 5B, a portion of the semiconductor device 510 where the hole H2 is formed includes a first semiconductor layer 518A in the first active region 512A, a second semiconductor layer 518B in the second active region 512B, and a first insulating pattern 526 disposed between the first and second semiconductor layers 518A and 518B.

The SDB structure 550 of the semiconductor device 510 in FIGS. 5B and 5C further includes a second insulating pattern (e.g., an upper insulating pattern) 528, and an opening 530, thereby providing physical isolation between the first active region 512A and the second active region 512B. In an embodiment, the SDB structure 550 is disposed over an insulating layer 516 and between the first and second semiconductor layers 518A and 518B, thereby electrically isolating the first and second semiconductor layers 518A and 581B from each other, together with the insulating layer 516.

Figures 6A, 6B:
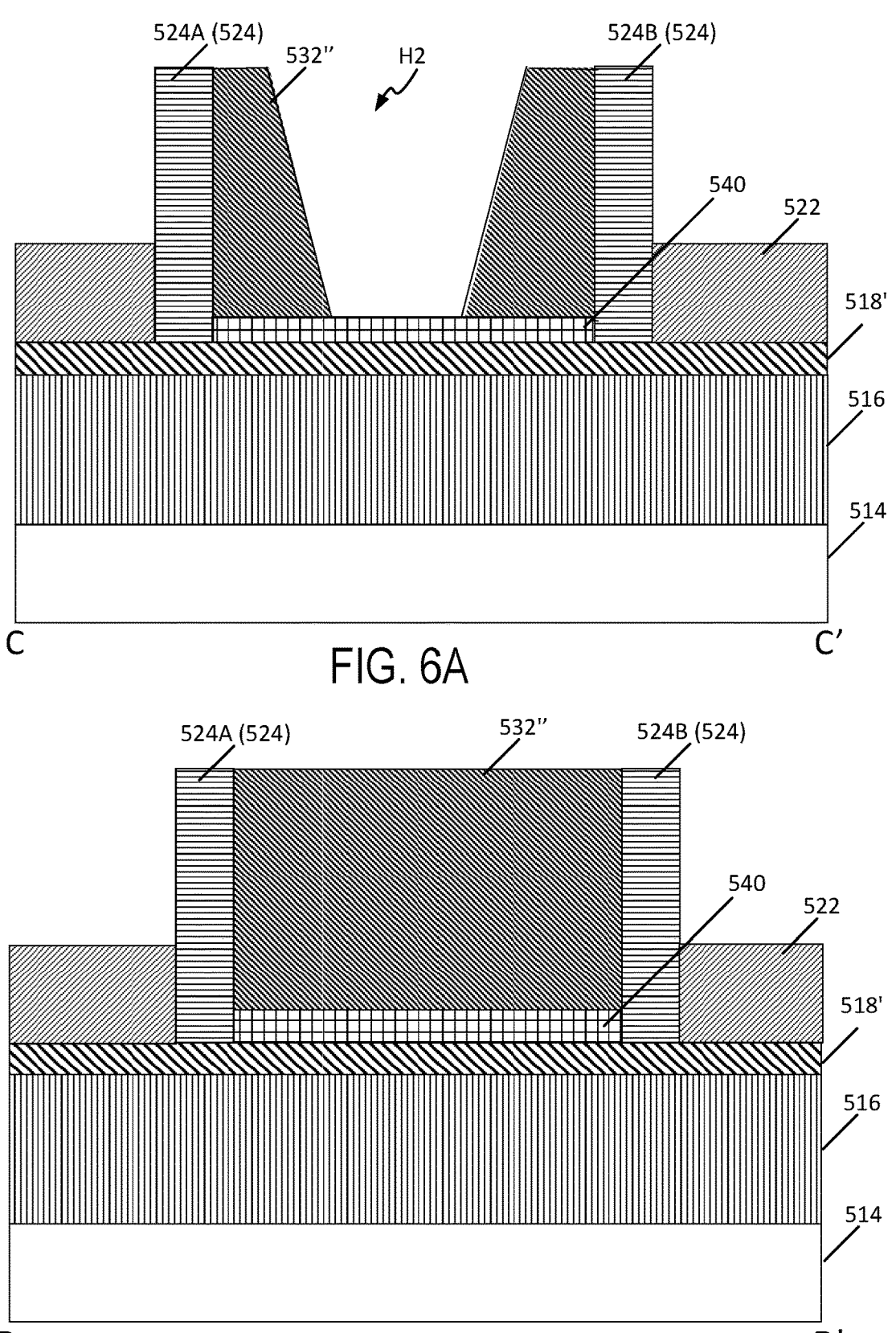
FIGS. 6A, 6B, 7A, and 7B illustrate a method of fabricating the semiconductor device in FIG. 5 according to an embodiment.
Figure 7A:
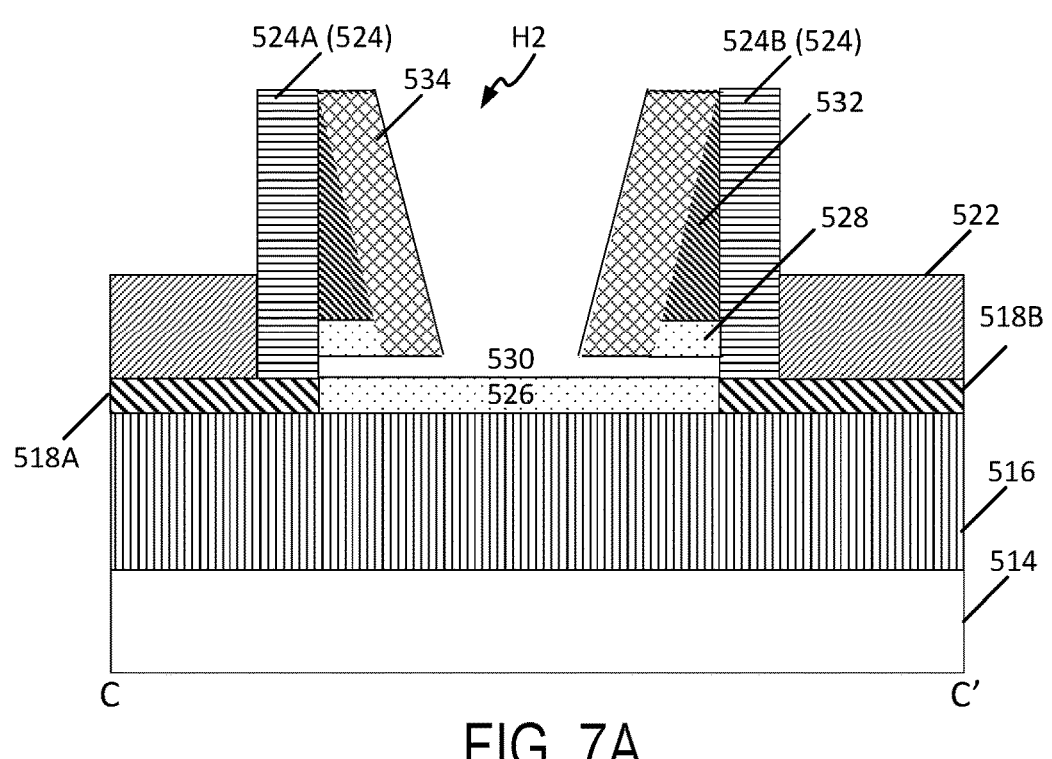
Figure 7B:
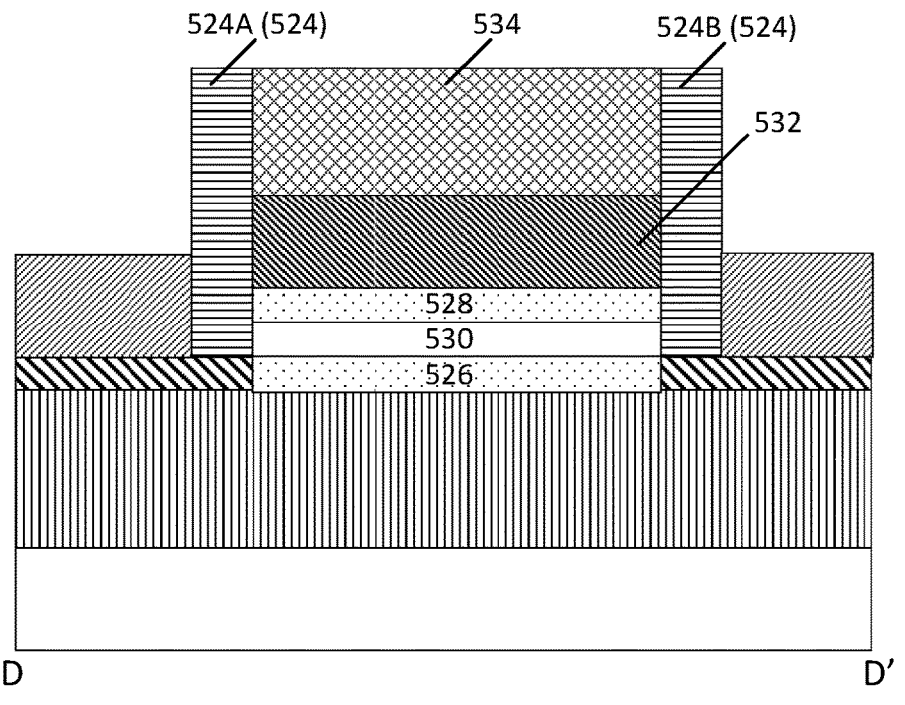

FIGS. 6A, 6B, 7A, and 7B illustrate a method of fabricating the semiconductor device 510 in FIG. 5 according to an embodiment. Specifically, FIGS. 6A and 7A are simplified cross-sectional views along the line C-C' shown in FIG. 5A, and FIGS. 6B and 7B are simplified cross-sectional views along the line D-D' shown in FIG. 5A. The method of fabricating the semiconductor device 510 in FIGS. 5A to 5C includes similar processes to those of the method of fabrication of the semiconductor device 110 in FIGS. 1A to 1C, and thus detailed descriptions of these processes may be omitted in the following disclosure in the interest of brevity.

Referring to FIGS. 6A and 6B, the method includes forming the hole H2 in a specific region of an initial gate electrode material (not shown) to form an intermediate gate electrode material 532", where the specific region is where a gate structure (e.g., a gate structure 520B in FIG. 5A) extends between the first and second active regions 512A and 512B in a longitudinal direction (e.g., a second direction of FIG. 5A) and lies inside an initial semiconductor layer 518'. In an embodiment, a mask pattern (not shown) is formed to expose the specific region of the initial gate electrode and an etching process is performed on the initial gate electrode material to form the hole H2 until a gate dielectric material (e.g., gate oxide material) 540 is exposed, thereby forming the intermediate gate electrode material 532".

Referring to FIGS. 7A and 7B, the method further includes forming a conductive gate material (e.g., silicide) 534 and the gate electrode material (e.g., polysilicon) 532 and selectively removing the gate dielectric material 540 to form an opening 530. The method further includes converting a portion of the initial semiconductor layer 518' into a first insulating pattern 526, or converting a portion of the gate electrode material 532 into a second insulating pattern 528, or both.

Figure 8A:
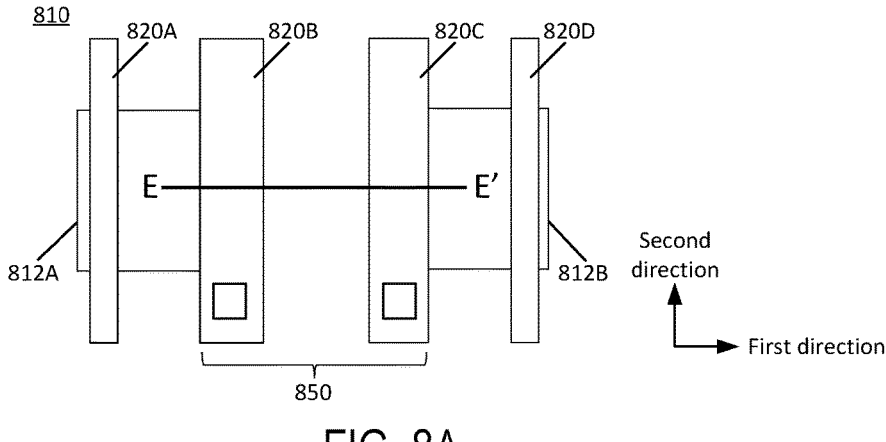
FIGS. 8A and 8B illustrate schematic views of a semiconductor device including a double diffusion break (DDB) structure according to an embodiment.
Figure 8B:
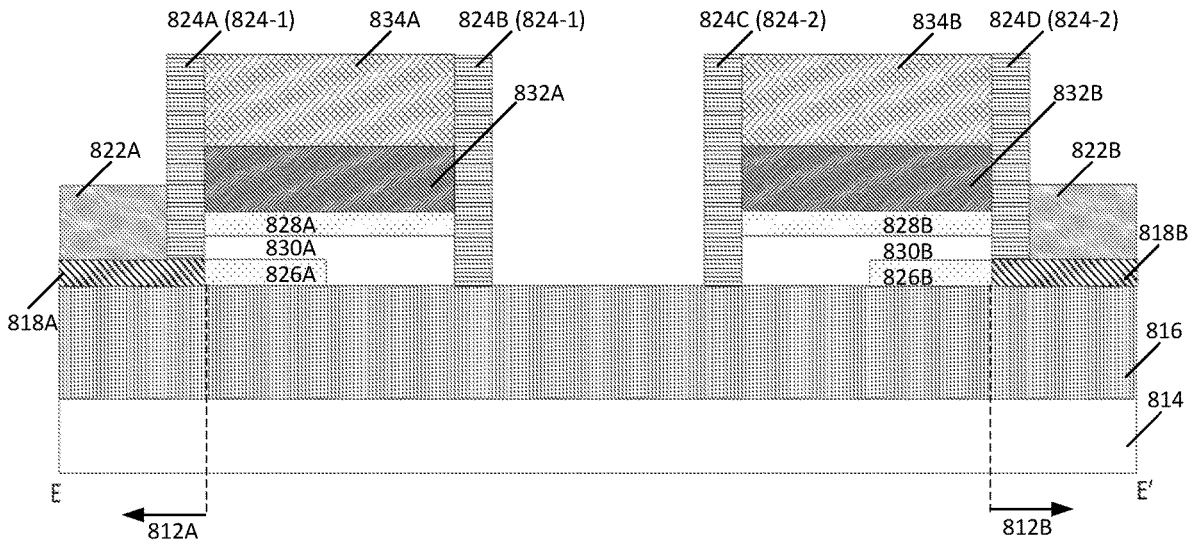

FIGS. 8A and 8B illustrate schematic views of a semiconductor device 810 including a double diffusion break structure (DDB) 860 according to an embodiment. For example, FIG. 8A is a schematic top view of the semiconductor device 810, and FIG. 8B is a cross-sectional view of the semiconductor device 810 along a line E-E' in FIG. 8A. The semiconductor device 810 may be an integrated circuit (IC) product (e.g., a logic device, a storage device, etc.), and may include NMOS transistors (NFETs).

Referring to FIG. 8A, the semiconductor device 810 includes a first active region 812A, a second active region 812B, and first, second, third, and fourth gate structures 820A, 820B, 820C, and 820D. In an embodiment, each of the first and fourth gate structures 820A and 820D functions as an active gate, whereas each of the second and third gate structures 820B and 820C functions as a non-functional gate. Although the embodiment shown in FIG. 8A includes four gate structures 820A, 820B, 820C, and 820C, embodiments of the present disclosure are not limited thereto. In other embodiments, one or both of the first and second active regions 812A and 812B further extend in a first direction (e.g., the horizontal direction with respect to the orientation of FIG. 8A) and one or more additional gate structures may be disposed over one or both of the extended active regions 812A and 812B.

The DDB structure 850 in FIG. 8A is disposed between the first and second active regions 812A and 812B to provide desirable isolation function. The DDB structure 850 in FIG. 8B includes first and second lower insulating patterns 826A and 826B, first and second upper insulating patterns 828A and 828B, and first and second openings 830A and 830B, thereby providing physical isolation between the first active region 812A and the second active region 812B. For example, a first semiconductor layer 818A abuts the lower insulating pattern 826A and a second semiconductor layer 818B abuts the second lower insulating pattern 826B to make the first semiconductor layer 818A spaced apart from the second semiconductor layer 818B by the first lower insulating pattern 826A, the first opening 830A, the second opening 830B, and the second lower insulating pattern 826B.

Figure 9A:
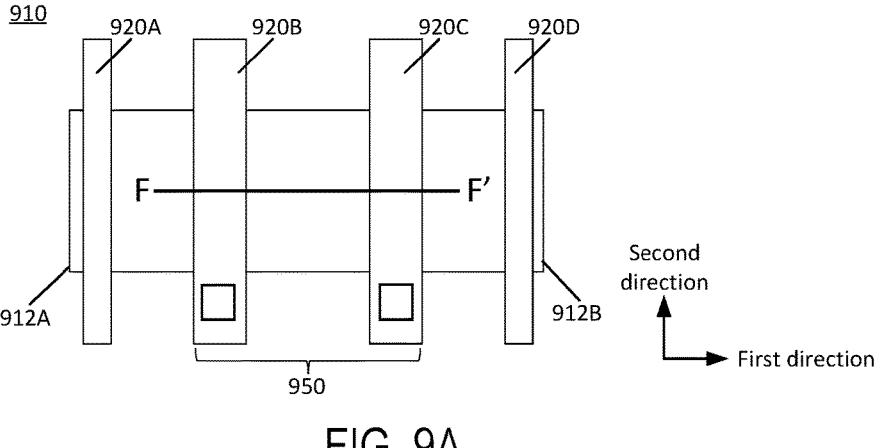
FIGS. 9A and 9B illustrate schematic views of a semiconductor device including a DDB structure according to an embodiment.
Figure 9B:
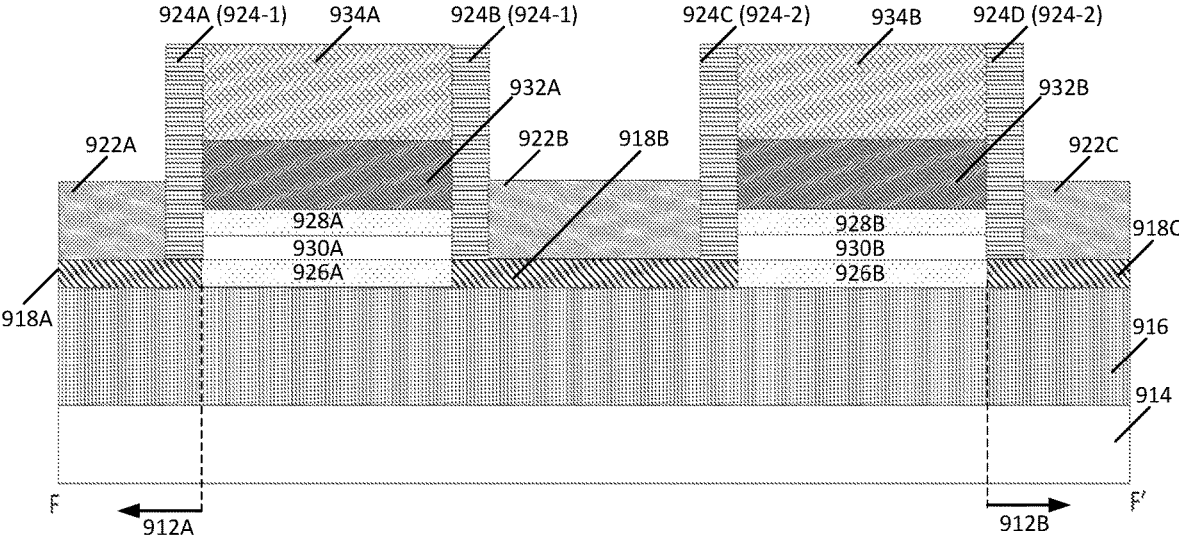

FIGS. 9A and 9B illustrate schematic views of a semiconductor device 910 including a double diffusion break (DDB) structure 960 according to an embodiment. For example, FIG. 9A is a schematic top view of the semiconductor device 910, and FIG. 9B is a cross-sectional view of the semiconductor device 910 along a line F-F' in FIG. 9A. The semiconductor device 910 may be an integrated circuit (IC) product (e.g., a logic device, a storage device, etc.), and may include NMOS transistors (NFETs), PMOS transistors (PFETs), or both.

Referring to FIG. 9A, the semiconductor device 910 includes a first active region 912A, a second active region 912B, and first, second, third, and fourth gate structures 920A, 920B, 920C, and 920D. In an embodiment, each of the first and fourth gate structures 920A and 920D functions as an active gate, whereas each of the second and third gate structures 920B and 920C functions as a non-functional gate.

The DDB structure 950 in FIG. 9A is disposed between the first and second active regions 912A and 912B to provide desirable isolation function. For example, the DDB structure 950 in FIG. 9B includes first and second lower insulating patterns 926A and 926B, first and second upper insulating patterns 928A and 928B, and openings 930A and 930B, thereby providing physical isolation between the first active region 912A and the second active region 912B. The first lower insulating pattern 926A is disposed between a first semiconductor layer 918A and a second semiconductor layer 918B, and the second lower insulating pattern 926B is disposed between the second semiconductor layer 918B and a third semiconductor layer 918C. Since the first lower insulating pattern 926A abuts the first semiconductor layer 918A and the second semiconductor layer 918B, and the second lower insulating pattern 926B abuts the second semiconductor layer 918B and the third semiconductor layer 918C, stress exerted along in a lateral direction (e.g., the first direction) in each of the first and second active regions 912A and 912B may be kept sufficiently high to improve performance of the transistors (e.g., PFETs) compared to conventional semiconductor devices.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A semiconductor device, comprising:
an insulating layer;
a first semiconductor layer over the insulating layer;
a diffusion break structure between a first active region and a second active region, the first active region including the first semiconductor layer, the diffusion break structure including a first insulating pattern over the insulating layer and an opening above the first insulating pattern; and
a conductive gate material over the opening,
wherein the first insulating pattern directly abuts the first semiconductor layer.

2. The semiconductor device of claim 1, further comprising a second semiconductor layer over the insulating layer, the second active region including the second semiconductor layer,
wherein the first insulating pattern directly abuts the second semiconductor layer.

3. The semiconductor device of claim 2, wherein the diffusion break structure further comprises a second insulating pattern between the opening and the conductive gate material.

4. The semiconductor device of claim 3, wherein the diffusion break structure further comprises a gate electrode material between the second insulating pattern and the conductive gate material, and wherein the conductive gate material includes silicide, and each of the first and second insulating patterns includes silicon oxide.

5. The semiconductor device of claim 3, wherein the diffusion break structure further comprises a gate electrode material between the second insulating pattern and the conductive gate material.

6. The semiconductor device of claim 2, further comprising a spacer including a first portion over the first semiconductor layer and a second portion over the second semiconductor layer,
wherein the opening and the conductive gate material are between the first and second portions of the spacer.

7. The semiconductor device of claim 2, wherein the first active region, the diffusion break structure, and the second active region are arranged in a first direction, and the opening extends in the first direction, and
wherein a gate structure includes the diffusion break structure, the conductive gate material, and a hole coupled to the opening, and the gate structure extends in a second direction intersecting the first direction.

8. The semiconductor device of claim 7, wherein the hole is in a region of the gate structure where the gate structure extends beyond the first and second active regions.

9. The semiconductor device of claim 7, wherein the hole is in a region of the gate structure between the first and second active regions.

10. The semiconductor device of claim 2, further comprising a third semiconductor layer over the insulating layer,
wherein the diffusion break structure further includes:
a second insulating pattern over the insulating layer and abutting the second and third semiconductor layers; and
a second opening over the second insulating pattern.

11. The semiconductor device of claim 1, wherein the opening is a first opening, the semiconductor device further comprising a second semiconductor layer over the insulating layer,
wherein the diffusion break structure further includes:
a second insulating pattern over the insulating layer and abutting the second semiconductor layer; and
a second opening over the second insulating pattern, and
wherein the first semiconductor layer is spaced apart from the second semiconductor layer by the first insulating pattern, the first opening, the second insulating pattern, and the second opening.

12. A semiconductor device, comprising:
an insulating layer;
a first gate structure in a first active region, the first active region including a first semiconductor layer over the insulating layer;
a second gate structure in a second active region, the second active region including a second semiconductor layer over the insulating layer; and
a third gate structure between the first and second gate structures, the third gate structure including a diffusion break structure and a conductive gate material over the diffusion break structure, the diffusion break structure including a first insulating pattern over the insulating layer and an opening over the first insulating pattern,
wherein the first insulating pattern abuts the first semiconductor layer and the second semiconductor layer, and
wherein the diffusion break structure further comprises:
a second insulating pattern disposed between the opening and the conductive gate material; and
a gate electrode material between the second insulating pattern and the conductive gate material.

13. The semiconductor device of claim 12, wherein the first active region, the diffusion break structure, and the second active region are arranged in a first direction,
wherein the third gate structure further includes a hole coupled to the opening, and the third gate structure extends in a second direction intersecting the first direction.

14. The semiconductor device of claim 13, wherein the hole is in a region of the third gate structure where the third gate structure extends beyond the first and second active regions.

15. A method of forming a semiconductor device, the method comprising:
forming an insulating layer;
forming a first semiconductor layer over the insulating layer;
forming a diffusion break structure between a first active region and a second active region of the semiconductor device, the first active region including the first semiconductor layer; and
forming a conductive gate material,
wherein forming the diffusion break structure comprises forming an opening and a first insulating pattern under the conductive gate material, and
wherein the first insulating pattern directly abuts the first semiconductor layer.

16. The method of claim 15, wherein forming the diffusion break further comprises forming a second semiconductor layer over the insulating layer, the second active region including the second semiconductor layer, and
wherein the first insulating pattern directly abuts the second semiconductor layer.

17. The method of claim 16, wherein forming the diffusion break further comprises forming a second insulating pattern between the opening and the conductive gate material.

18. The method of claim 15, wherein a gate structure includes the diffusion break structure and the conductive gate material, the method further comprising forming a hole in a region of the gate structure where the gate structure extends beyond the first and second active regions.

19. The method of claim 18, wherein the opening is formed by applying an etchant through the hole to selectively remove a gate dielectric material in the gate structure.

20. The method of claim 19, wherein the first insulating pattern is formed by applying the etchant is applied through the hole to increase stress exerted on the first active region.

* * * * *